US008227978B2

United States Patent
Lee et al.

(10) Patent No.: US 8,227,978 B2
(45) Date of Patent: Jul. 24, 2012

(54) WHITE ORGANIC LIGHT EMITTING DEVICE AND COLOR DISPLAY APPARATUS EMPLOYING THE SAME

(75) Inventors: Sung-hun Lee, Yongin-si (KR); Sung-kee Kang, Yongin-si (KR); Sang-yeol Kim, Yongin-si (KR); Mu-gyeom Kim, Yongin-si (KR); Jung-bae Song, Yongin-si (KR)

(73) Assignees: Samsung Electronics Co., Ltd., Yeongtong-gu, Suwon-si, Gyeonggi-do (KR); Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 414 days.

(21) Appl. No.: 12/153,701

(22) Filed: May 22, 2008

(65) Prior Publication Data
US 2009/0096358 A1    Apr. 16, 2009

(30) Foreign Application Priority Data

Oct. 10, 2007 (KR) .......... 10-2007-0102143
Jan. 14, 2008 (KR) .......... 10-2008-0003932

(51) Int. Cl.
*H01J 1/64* (2006.01)
(52) U.S. Cl. ..................................... 313/506
(58) Field of Classification Search .......... 313/498–512; 315/169.3, 169.4
See application file for complete search history.

(56) References Cited

U.S. PATENT DOCUMENTS

| | | | |
|---|---|---|---|
| 5,780,174 A * | 7/1998 | Tokito et al. | 428/690 |
| 6,849,869 B1 * | 2/2005 | O'Regan et al. | 257/40 |
| 2002/0067749 A1 * | 6/2002 | Araki | 372/43 |
| 2005/0212407 A1 | 9/2005 | Matsusue | |
| 2006/0066220 A1 * | 3/2006 | Choong et al. | 313/501 |
| 2007/0046180 A1 * | 3/2007 | Kao et al. | 313/504 |
| 2007/0069996 A1 * | 3/2007 | Kuba et al. | 345/76 |

FOREIGN PATENT DOCUMENTS
WO    2006/073908    7/2006

OTHER PUBLICATIONS

Zhang et al. "Organic white-light-emitting devices based on a multimode resonant microcavity" Semicond. Sci. Technol. 21 (2006) 1094-1097.*
Yang et al. "Spatial Resonances and Superposition Patterns in a Reaction-Diffusion Model with Interacting Turing Modes." Physical Review Letters, vol. 88, No. 20; May 20, 2002.*
Search report from the European Patent Office issued in Applicant's corresponding European Patent Application No. 08158507.7 dated Feb. 19, 2009.

(Continued)

*Primary Examiner* — Peter Macchiarolo
(74) *Attorney, Agent, or Firm* — Robert E. Bushnell, Esq.

(57) ABSTRACT

A top emission type white organic light emitting device (OLED) has a high resolution and a wide color gamut, and a color display apparatus uses the same. The white OLED includes a substrate; a reflective electrode formed on the substrate; an organic light emitting layer formed on the reflective electrode; a semi-transparent electrode formed on the organic light emitting layer; and in the white OLED, a wavelength of a resonating mode determined by an optical thickness between the reflective electrode and semi-transparent electrode is shorter than a shortest wavelength in a visible light region of a white light spectrum generated in the organic light emitting layer.

20 Claims, 10 Drawing Sheets

10

OTHER PUBLICATIONS

Xiuling Zhu et al., : "High-perfomance top-emitting white organic light-emitting devices", Japanese Journal of Applied Physics, vol. 46, No. 7a, Jul. 4, 2007, pp. 4054-4058, XP002513564.

Shih-Feng Hsu et al., : Highly efficient top-emitting white organic electroluminescent devices, Applied Physics Letters, vol. 86, May 16, 2005, pp. 253508-1-253508-3, XP002513565.

Physical Thickness & Optical Thickness at http://www.tokaiopt.co.jp/thinfilm/english/Technical-Topics/TechnicalTerms/Phisical-Optical/Phy-Opt-Thickness.htm.

Optical Cavity—Wikipedia at http://en.wikipedia.org/wiki/Optical_cavity.

* cited by examiner

WHITE ORGANIC LIGHT EMITTING DEVICE AND COLOR DISPLAY APPARATUS EMPLOYING THE SAME

CLAIM OF PRIORITY

This application claims the benefit of Korean Patent Application Nos. 10-2007-0102143, filed on 10 Oct. 2007 and 10-2008-0003932, filed on 14 Jan. 2008 in the Korean Intellectual Property Office, the disclosure of which is incorporated herein in its entirety by reference.

BACKGROUND OF THE INVENTION

1. Field of the Invention

The present invention relates to a white organic light emitting device (OLED) and a color display apparatus using the same, and more particularly, to a top emission type white OLED realizing high resolution and having a wide color gamut, and a color display apparatus using the same.

2. Description of the Related Art

An organic light emitting device (OLED) is a display device which forms images by emitting light when holes supplied from an anode and electrons supplied from a cathode are combined in an organic light emitting layer formed between the anode and the cathode. The OLED has excellent display characteristics such as a wide viewing angle, a high response speed, a small thickness, low manufacturing costs, and a high contrast ratio, and thus has recently be considered as a next-generation flat panel display device.

In general, in order to obtain improved light emitting characteristics, the OLED may have a multi-layer structure further including a hole injection layer and a hole transporting layer formed between the anode and the organic light emitting layer, and an electron injection layer and an electron transporting layer formed between the cathode and the organic light emitting layer. In addition, layers other than the above described layers may be additionally formed.

The OLED including organic light emitting layer may emit lights with a desired color. Therefore, a color display device may employ such an OLED emitting lights with a desired color. For example, in a color display apparatus including an OLED, each pixel may be formed of a sub-pixel having an organic light emitting layer emitting a red color, a sub-pixel having an organic light emitting layer emitting a green color, and a sub-pixel having an organic light emitting layer emitting a blue color. Forming organic light emitting layers separately for each sub-pixel, however, may cause unnecessarily complicated manufacturing processes and introduce difficulty to the manufacture of a display device with a large surface and a high resolution.

Consequently, a white OLED has been suggested. A white OLED may be realized by forming a plurality of organic light emitting materials separately emitting red, green, and blue colors in an organic light emitting layer, or by forming pairs of two organic light emitting materials in a complementary color relationship. A white OLED may employ color filters to generate light with different colors. In this case, the structure of the organic light emitting layer of all sub-pixels may be formed identically, and thus it is relatively easy to manufacture a display device with a large display surface and a high display resolution.

Meanwhile, OLEDs may be classified into a bottom emission type OLED and a top emission type OLED, according to the direction in which light generated from an organic light emitting layer is emitted. In a bottom emission type OLED, light is extracted through a bottom surface on which a thin film transistor (TFT) driving the OLED is formed. On the other hand, in a top emission type OLED, a reflective electrode is formed in a lower portion of an organic light emitting layer and light is extracted through an upper portion of the TFT. In general, the top emission type OLED is more advantageous in comparison with the bottom emission type OLED in terms of achieving high resolution because the top emission type OLED may have a greater light emitting area (aperture ratio).

In the top emission type OLED, however, a resonance cavity is necessarily formed between the reflective electrode of the organic light emitting layer and a semi-transparent electrode in the upper portion of the organic light emitting layer. Resonance generated in such a resonance cavity narrows spectrums of light emitted to the exterior, and thus being advantageous in terms of extracting light of a predetermined wavelength only, but being disadvantageous in terms of extracting white light.

SUMMARY OF THE INVENTION

It is therefore one object of the present invention to provide an improved top emission type white organic light emitting device in order to overcome the disadvantages stated above.

It is another object of the present invention to provide a top emission type white organic light emitting device (OLED) realizing high resolution and having a wide color gamut.

According to an aspect of the present invention, there is provided a white organic light emitting device (OLED) including a substrate; a reflective electrode formed on the substrate; an organic light emitting layer formed on the reflective electrode; a semi-transparent electrode formed on the organic light emitting layer; and with a wavelength of a resonating mode determined by an optical thickness between the reflective electrode and semi-transparent electrode being shorter than a shortest wavelength in a visible light region of a white light spectrum generated in the organic light emitting layer.

A reflectivity of the semi-transparent electrode may be in a range of 0.1% to 50%.

The reflectivity of the semi-transparent electrode may be in a range of 10 to 50%.

The reflective electrode may have one of a transparent conductive oxide/metal/transparent conductive oxide structure and a metal/transparent conductive oxide structure.

For example, the transparent conductive oxide may include one of an indium tin oxide (ITO) and an indium zinc oxide (IZO).

The white OLED may further include a capping layer formed on the semi-transparent electrode and formed of a transparent dielectric material having a refractive index in a range of 1.4 to 2.4.

The white OLED may further include an optical path control layer that is formed on the semi-transparent electrode, to form an additional resonator in cooperation with the reflective electrode and the semi-transparent electrode.

The optical path control layer may be formed of a material having a light transmittivity of 90% or greater in a visible light region.

The optical path control layer may be formed of at least one combination selected from the group consisting of $Al_2O_3$, BaO, MgO, $HfO_2$, $ZrO_2$, $CaO_2$, $SrO_2$, $Y_2O_3$, $Si_3N_4$, AlN, GaN, ZnS, and CdS.

The organic light emitting layer may include a hole injection layer, a hole transporting layer, a white light emitting layer, an electron transporting layer, and an electron injection layer sequentially stacked on the reflective electrode, and the reflective electrode is an anode, and the semi-transparent electrode is a cathode.

The organic light emitting layer may include an electron injection layer, an electron transporting layer, a white light emitting layer, a hole transporting layer, and a hole injection layer sequentially stacked on the reflective electrode, and the reflective electrode is a cathode, and the semi-transparent electrode is an anode.

According to another aspect of the present invention, there is provided a color display apparatus including: a bottom substrate; a plurality of reflective electrodes formed on the bottom substrate; an organic light emitting layer formed on the reflective electrodes; a semi-transparent electrode formed on the organic light emitting layer; a top substrate disposed to face the semi-transparent electrode; a plurality of color filters formed in positions corresponding to the reflective electrodes on a lower surface of the top surface; and with a wavelength of a resonating mode determined by an optical thickness between the reflective electrodes and semi-transparent electrode being shorter than a shortest wavelength in a visible light region of a white light spectrum generated in the organic light emitting layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown. In the drawings, like reference numerals denote like elements, and the size of the elements may be exaggerated for clarity and convenience of description.

Figure 1:
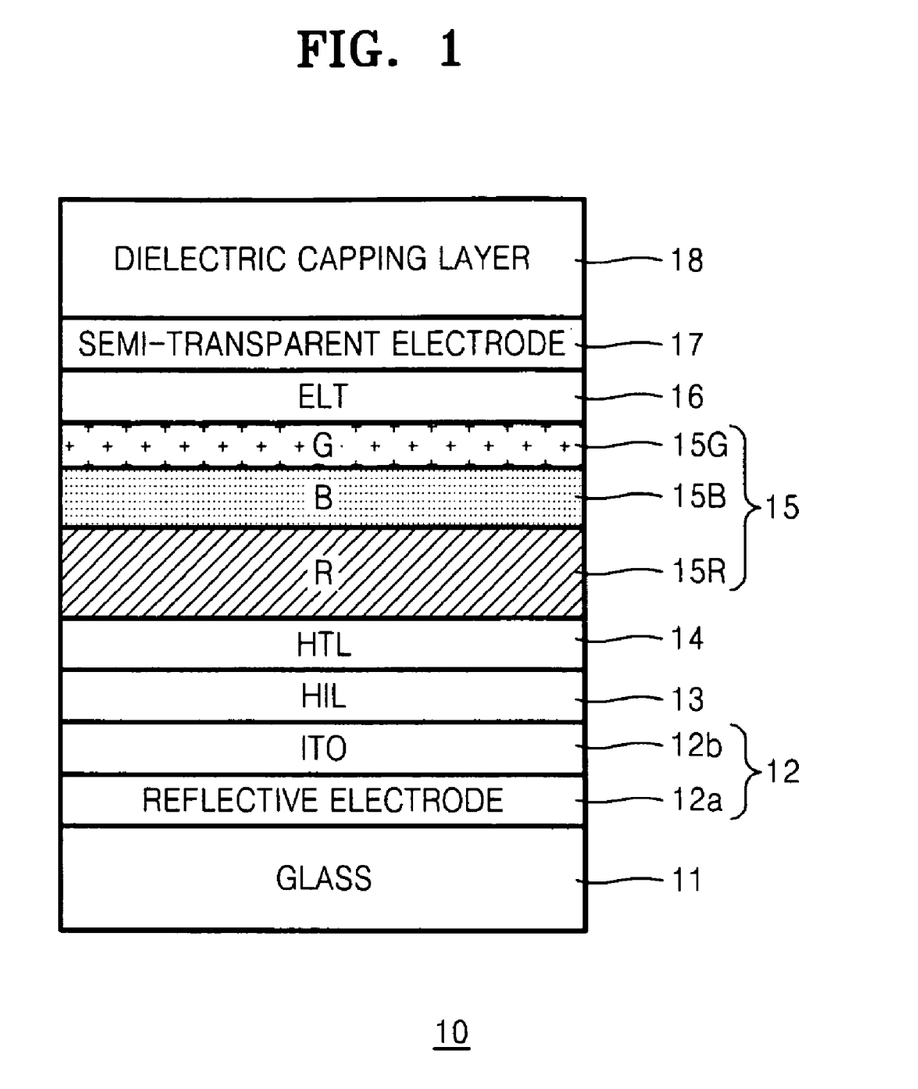
FIG. 1 is a schematic view of a structure of a top emission type white organic light emitting device (OLED) constructed as an embodiment of the present invention.

FIG. 1 is a schematic view of a general structure of a top emission type white organic light emitting device (OLED) 10. Referring to FIG. 1, white OLED 10 may include an anode 12, a hole injection layer (HIL) 13, a hole transporting layer (HTL) 14, a white light emitting layer 15, an electron transporting layer (ETL) 16, a cathode 17, and a capping layer 18 that are sequentially stacked on a substrate 11. Anode 12 functions as a reflective electrode reflecting white light generated in white light emitting layer 15, and cathode 17 functions as a semi-transparent electrode that transmits a portion of the white light generated in white light emitting layer 15 and reflects a remaining portion of the white light.

The stack order of the layers in FIG. 1 may be reversed. For example, cathode 17 may be first formed on substrate 11, and n ETL 16, white light emitting layer 15, HTL 14, HIL 13, anode 12, and capping layer 18 may be sequentially formed on cathode 17. In this case, cathode 17 functions as a reflective electrode, and anode 12 functions as a semi-transparent electrode. In this specification, the case where anode 12 is a reflective electrode, and cathode 17 is a semi-transparent electrode will be described for convenience of description. It should be noted however that this situation may be reversed according to another embodiment of the present invention.

White light emitting layer 15 may be formed in various structures in order to generate white light. In FIG. 1, white light emitting layer 15 is formed of a red light emitting layer 15R, a blue light emitting layer 15B, and a green light emitting layer 15G. White light emitting layer 15 however may also be formed of two light emitting materials emitting light that have a complementary color relationship.

Also, although not shown in FIG. 1, an electron injection layer may be further interposed between cathode 17 and ETL 16. Substrate 111 may be formed of a material such as glass, and capping layer 18 may be formed of a transparent dielectric material having a refractive index of about 1.4 to 2.4, which does not absorb white light. Anode 12 may be formed of a metal reflective electrode 12a reflecting light generated in white light emitting layer 15 and a transparent electrode 12b formed of a transparent conductive oxide (TCO) having a relatively high work function to provide holes. For example, reflective electrode 12a may be formed of Ag having high reflectivity, and transparent electrode 12b may be formed of indium tin oxide (ITO) or indium zinc oxide (IZO). In FIG. 1, anode 12 may be formed of a metal/TCO layer-structure, and anode 12 may also be a TCO/metal/TCO structure. Meanwhile, cathode 17 is formed to have a semi-transparent characteristic by thinly coating a metal having a relatively low work function.

Top emission type white OLED 10 is advantageous in manufacturing a display device with a large display surface and a high display resolution. Since resonance occurs between cathode 17 having a semi-transparent characteristic and reflective electrode 12a, pure white light is difficult to be obtained. This is because the spectrum of emitted light is narrowed by the resonance between cathode 17 and reflective electrode 12a.

The inventors of the present invention have discovered that a pure white color may be obtained by properly selecting a resonance condition in white OLED 10. In general, a wavelength of a resonating mode of a resonator, that is, a resonance wavelength, is determined by an optical thickness of the resonator. Optical thickness is obtained by multiplying the physical thickness of a medium and the refractive index of that medium together. Also, a plurality of resonating modes that satisfy a resonance condition in a region of wavelengths that are shorter than the resonance wavelength exist inside the resonator having a predetermined resonance wavelength. Accordingly, if a spectrum region of white light generated in white OLED 10 is in a larger spectrum region than the resonance wavelength, a pure white color may be realized by minimizing the influence of resonance. In particular, when a very intense resonance occurs in a region of wavelengths that are shorter than the shortest wavelength in a visible light region of a white light spectrum generated in white OLED 10, a change in the light amount due to the wavelength change in the visible light region of the white light spectrum may be reduced so as to be very small.

The condition for a resonating mode to be present in the resonator having a plurality of organic layers including white light emitting layer 15 between semi-transparent cathode 17 and reflective electrode 12a of the above-described white OLED 10 is generally given as the following Formula 1.
Formula 1

$$2\pi \cdot q = \sum_j \left( \frac{2\pi 2 n_{j\lambda} d_j}{\lambda} + \delta_j \right), \quad (1)$$

where $n_{j\lambda}$ is a refractive index of a j-th organic layer with respect to a wavelength $\lambda$, $d_j$ is the thickness of a j-th organic layer, and $\delta_j$ is the degree of phase shift shown when light is transmitted through the j-th organic layer and when light is reflected on both mirrors. Also, q is an arbitrary integer. Here, if q is greater than 1, a very intense resonance occurs in the resonator, and the greater the value of q, the greater the intensity of the resonance. If q is 0, a weak resonance occurs. According to the present invention, an intense resonance should occur in a region of wavelengths that are shorter than the shortest wavelength in a visible light region of a white light spectrum generated in white OLED 10. Accordingly, in order to realize a pure white color, a following inequality as given by Formula 2 should be satisfied.
Formula 2 is shown as follows:

$$\lambda_{min} > \sum_j \frac{4\pi \cdot n_{j\lambda} d_j}{2\pi - \delta_j}, \quad (2)$$

Here, a wavelength $\lambda_{min}$ may be the shortest wavelength in a visible light region of a white spectrum emitting light in white light emitting layer 15 of white OLED 10. For example, wavelength $\lambda_{min}$ may be about 400 nm or less. If the optical thickness between cathode 17 and reflective electrode 12a is too great and thus the right side of Formula 2, that is, the wavelength of the resonating mode, is greater than $\lambda_{min}$, a pure white color may not be obtained. As can be seen from Formula 2, in order to obtain a pure white color, the wavelength of the resonating mode considering the optical thickness between cathode 17 and reflective electrode 12a, and the phase shift, that is, the value of the right side of Formula 2, should be smaller than $\lambda_{min}$.

Hereinafter, conditions for obtaining an a pure white color in top emission type white OLED 10 having the structure of FIG. 1 will be described in details with reference to computer simulated results.

First Computer Simulation is Performed in the Case where Formula 2 is Satisfied.

Figure 2:
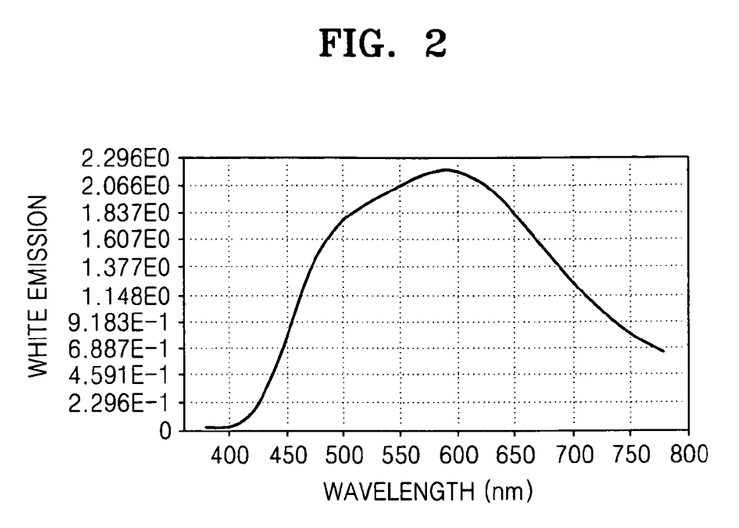
FIG. 2 is a two dimensional computer simulated graph of the amount of light of a white point light source emitted to the outside at a predetermined light emitting position in the white OLED of FIG. 1 when the resonance condition according to the principle of the present invention is satisfied.
Figure 3:
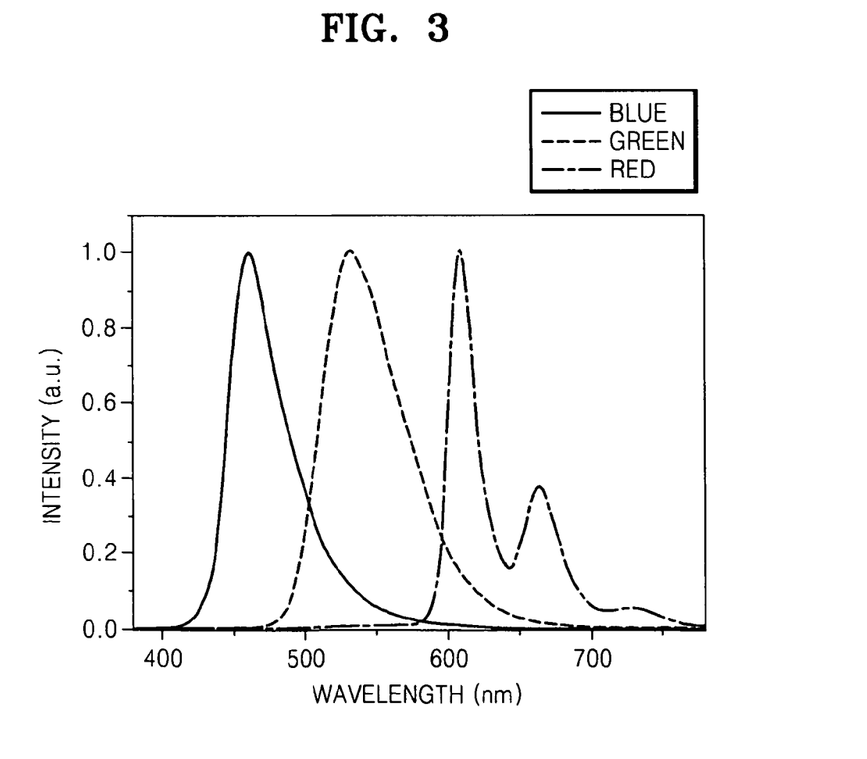
FIG. 3 is a two dimensional graph showing spectrums of red, blue, and green light used in computer simulation according to the principle of the present invention.
Figure 4:
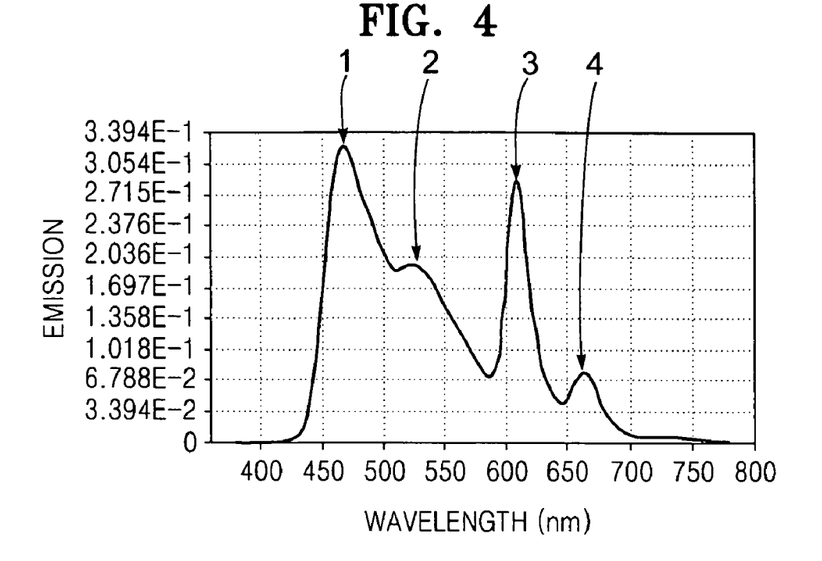
FIG. 4 is a two dimensional computer simulated graph of the amount of light of red, blue, and green point light sources emitted to the outside at a predetermined light emitting position in the white OLED of FIG. 1 when the resonance condition according to the principle of the present invention is satisfied.

Referring now to FIGS. 2-4, a first computer simulation was performed where Formula 2 is satisfied in such a manner that an optical thickness between cathode 17 and reflective electrode 12a was 200 nm, a wavelength of a resonating mode considering phase shift, that is, a resonance wavelength, was 314 nm, and a thickness of capping layer 18 was 40 nm, so that top emission type white OLED 10 having the structure of FIG. 1 satisfies Formula 2. The reflectivity of cathode 17 which functions as a semi-transparent electrode was set as 25%. Also, it was assumed that identical white point light sources having identical intensities are respectively disposed at a red light emitting layer 15R, a blue light emitting layer 15B, and a green light emitting layer 15G in white light emitting layer 15 in FIG. 1. FIG. 2 is a computer simulated graph of the amount of light emitted from the white point light sources to the outside under the above conditions. Referring to FIG. 2, in general, a resonance characteristic is relatively broadly and uniformly formed in the visible light region.

Meanwhile, in order to predict spectrums of red, blue, and green light respectively emitted from red light emitting layer 15R, blue light emitting layer 15B, and green light emitting layer 15G to the outside, using the result of FIG. 2, red, blue, and green spectrums as illustrated in FIG. 3 were considered. In other words, FIG. 3 is a graph showing internal light emitting spectrums with respect to red (R), blue (B), and green (G) light respectively generated in red light emitting layer 15R, blue light emitting layer 15B, and green light emitting layer 15G.

FIG. 4 is a graph of a computer simulation result of an external light emitting spectrum obtained by multiplying the result of the graph of FIG. 2 with the internal light emitting spectrums of the red, green, and blue light of FIG. 3 at a ratio of 2.3:0.6:2. Here, since the graph of FIG. 3 is based on a normalized value, the ratio is multiplied with the internal light emitting spectrums of FIG. 3 to obtain the actual characteristics of white light emitting layer 15. Accordingly, FIG. 4 is a computer simulation graph of the amount of red, blue, and green light respectively emitted from red light emitting layer 15R, blue light emitting layer 15B, and green light emitting layer 15G in white OLED 10 illustrated in FIG. 1 to the outside. Peak 1 represents the amount of blue light emitted from blue light emitting layer 16B, peak 2 represents the amount of green light emitted from blue light emitting layer 16G, and peaks 3 and 4 represents the amount of red light emitted from red light emitting layer 16R. As can be seen from the graph of FIG. 4, an almost pure white spectrum can be obtained at (0.31, 0.32) of the chromaticity coordinates.

Second Computer Simulation is Performed in the Case where Formula 2 is not Satisfied.

Figure 5:
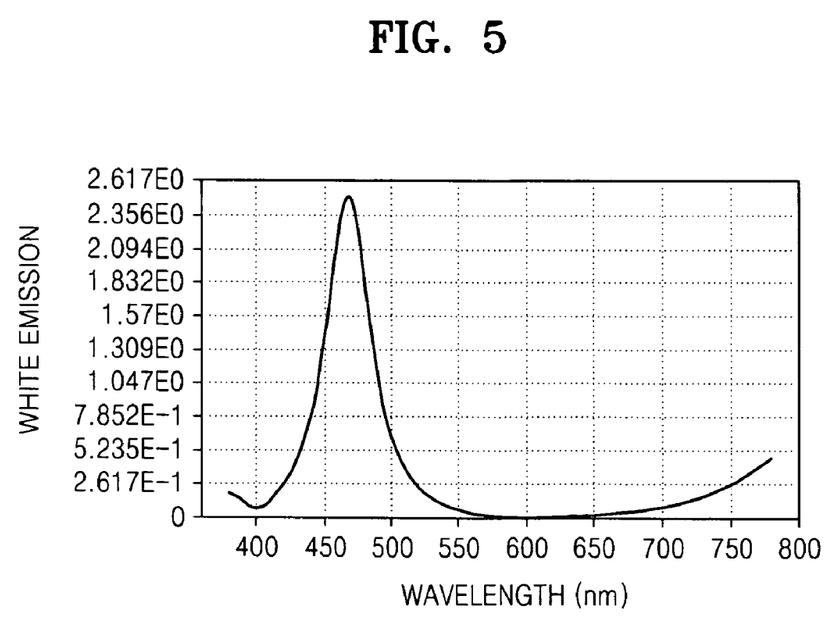
FIG. 5 is a two dimensional computer simulated graph of the amount of light of a white point light source emitted to the outside at a predetermined light emitting position in the white OLED of FIG. 1 when the resonance condition according to the principle of the present invention is not satisfied.

Referring now to FIGS. 5 and 7, a second computer simulation was performed where Formula 2 is not satisfied in such a manner that an optical thickness between cathode 17 and reflective electrode 12a was 360 nm, a resonance wavelength considering phase shift was 470 nm, and a thickness of capping layer 18 was 40 nm, so that top emission type white OLED 10 having the structure of FIG. 1 does not satisfy Formula 2. The reflectivity of cathode 17 functioning as a semi-transparent electrode was set as 25%. Also, it was assumed that identical white point light source having identical intensities were respectively disposed at red light emitting layer 15R, blue light emitting layer 15B, and green light emitting layer 15G. FIG. 5 is a computer simulation result graph of the amount of light respectively emitted from each of the point light sources to the exterior under the above conditions. Referring to FIG. 5, a very narrow light emitting spectrum is formed around wavelength of 470 nm.

Figure 6:
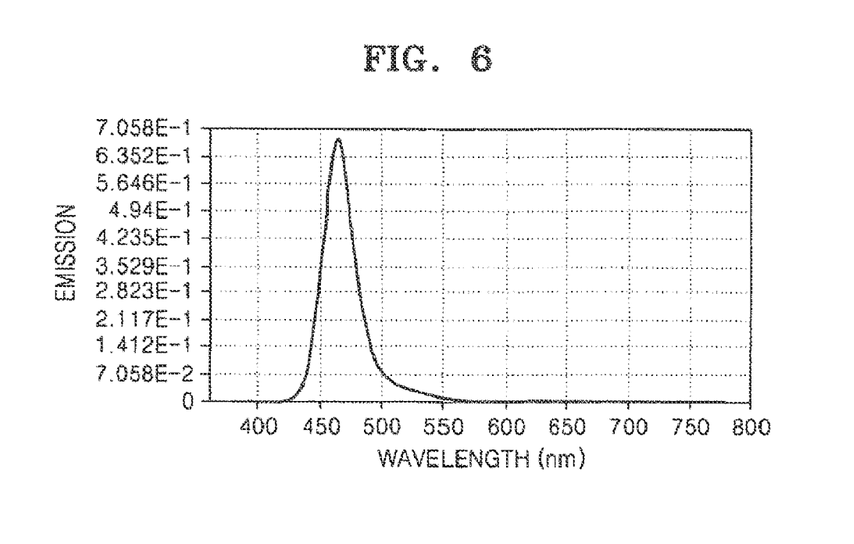
FIG. 6 is a two dimensional computer simulated graph of the amount of light of red, blue, and green point light sources emitted to the outside at a predetermined light emitting position in the white OLED of FIG. 1 when the resonance condition according to the principle of the present invention is not satisfied.

FIG. 6 is a computer simulation graph of an external light emitting spectrum obtained by multiplying the result shown in the graph of FIG. 5 with the internal light emitting spectrums of the red, green, and blue light (wavelength is around 470 nm) of FIG. 3 at the ratio of 2.3:0.6:2. In other words, FIG. 6 is a computer simulation graph of the amount of red, blue, and green light respectively emitted from red light emitting layer 15R, blue light emitting layer 15B, and green light emitting layer 15G in white OLED 10 illustrated in FIG. 1 to the exterior. Referring to FIG. 6, a near pure blue spectrum is formed at (0.135, 0.88) of the chromaticity coordinates. Accordingly, when white OLED 10 is designed without considering the resonance condition of the present invention, primary color light may be emitted instead of white color light in an extreme case.

As can be seen from the description with reference to the above-described first and second computer simulations, an approximately pure white color light may be obtained according to the present invention. The reflectivity of cathode 17, which is the semi-transparent electrode, was set as 25% in the first computer simulation; however, the reflectivity may be varied according to different embodiments. In general, when the reflectivity in a semi-transparent electrode in a resonator cavity formed of a semi-transparent electrode and a reflective electrode is decreased, the resonator is weakened, and thus the full width at half maximum (FWHM) of the extracted spectrum is increased, and dependency of brightness and color viewing angle is minimized. In order to obtain the above characteristics, the reflectivity of cathode 17 functioning as a semi-transparent electrode may be about 0.1-50%, and preferably about 10-50%.

Figure 7A:
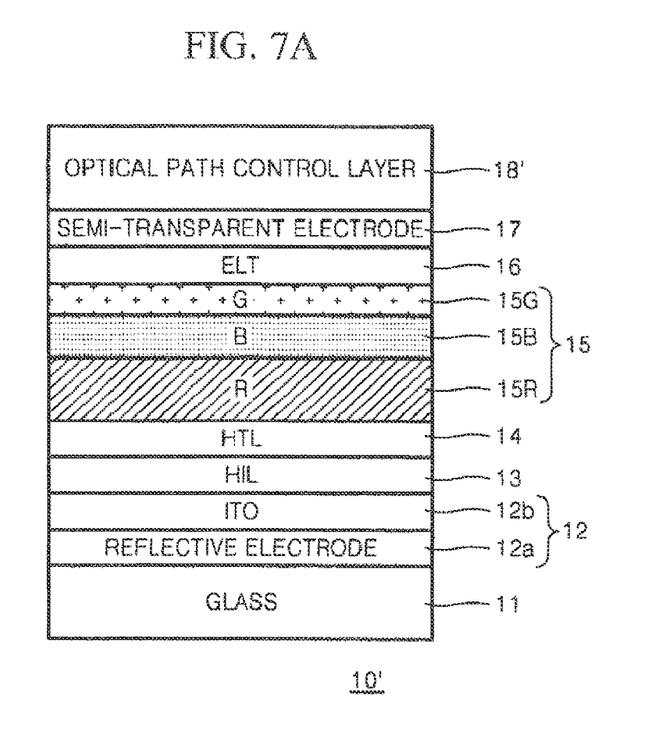
FIG. 7A is a schematic view of a top emission type white OLED including an optical path control layer.

In addition, a dielectric layer having high transmittivity may be formed on the semi-transparent electrode so that a broader spectrum may be extracted in the semi-transparent electrode having the above-described reflectivity. FIG. 7A is a schematic view of a top emission type white OLED 10' including the dielectric layer having the high transmittivity. White OLED 10' of FIG. 7A includes an optical path control layer 18' which replaces capping layer 18 included in white OLED 10 of FIG. 1. Optical path control layer 18' is formed in order to increase the amount of light emitted to the exterior of white OLED 10' and obtain a purer white color, and is formed of a material having high light transmittivity. For example, the light transmittivity of optical path control layer 18' may preferably be about 90% or greater in the visible light region. Optical path control layer 18' may be formed of at least one combination selected from the group consisting of an organic material, an oxide, a nitride, and a sulfide; for example, at least one combination selected from the group consisting of $Al_2O_3$, $BaO$, $MgO$, $HfO_2$, $ZrO_2$, $CaO_2$, $SrO_2$, $Y_2O_3$, $Si_3N_4$, $AlN$, $GaN$, $ZnS$, and $CdS$.

Figure 7B:
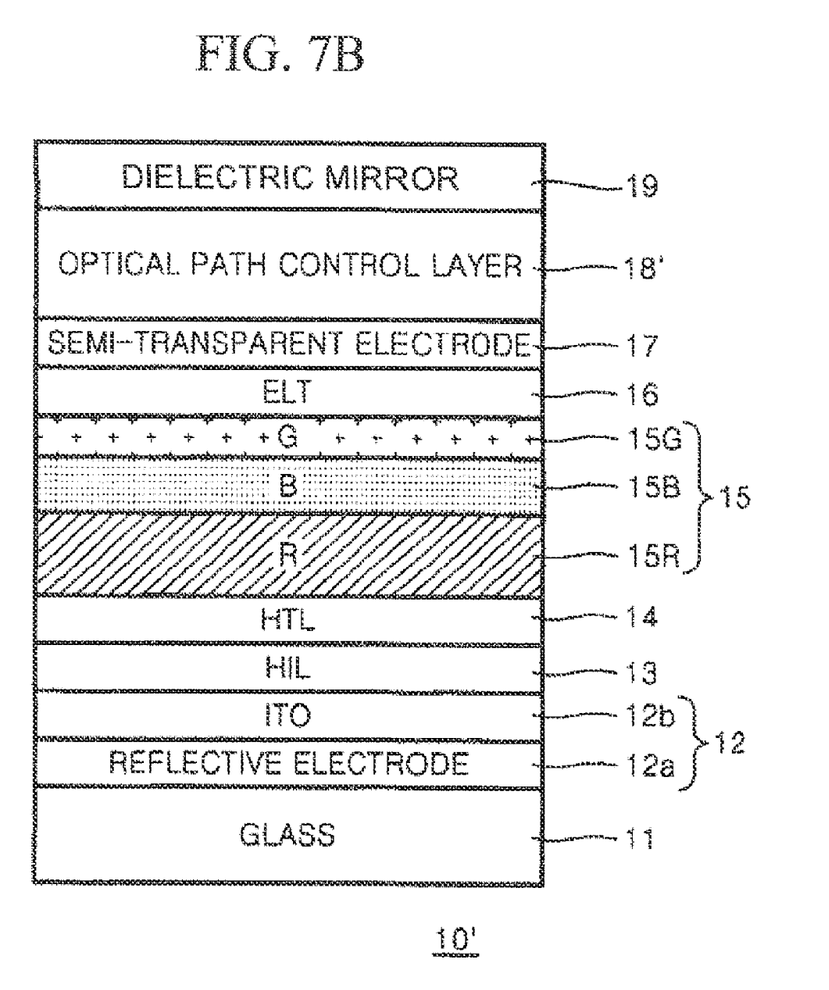
FIG. 7B is a schematic view of a top emission type white OLED including an optical path control layer and a dielectric mirror layer.

In FIG. 7A, optical path control layer 18' is illustrated to have a small thickness. In order to obtain effective resonance; however, the thickness of optical path control layer 18' may preferably be great according to a Febry-Perot interference condition. Accordingly, in comparison with capping layer 18, optical path control layer 18' may be regarded as being formed of the same material as capping layer 18 but having a thickness than greater than that of capping layer 18. For example, the thickness of optical path control layer 18' may be about 300-400 nm at the minimum and about 700-900 nm at the maximum. Then a resonator is formed between cathode 17, which is the semi-transparent electrode, and reflective electrode 12a, between an upper surface of optical path control layer 18' and reflective electrode 12a, and between upper and lower surfaces of optical path control layer 18'. Also, as shown in FIG. 7B, in order to further increase the reflectivity, a dielectric mirror 19 formed of repeated dielectric layers having high and low refractive indices, or a thin layer metal mirror may be further formed on the upper surface of optical path control layer 18'. Thus a broader spectrum may be obtained by multiple resonances. In addition, a third computer simulation was performed to see to analyze the broader spectrum.

A Third Computer Simulation is Performed in the Case where Formula 2 is Satisfied and an Optical Path Control Layer 18' is Included.

Figure 8:
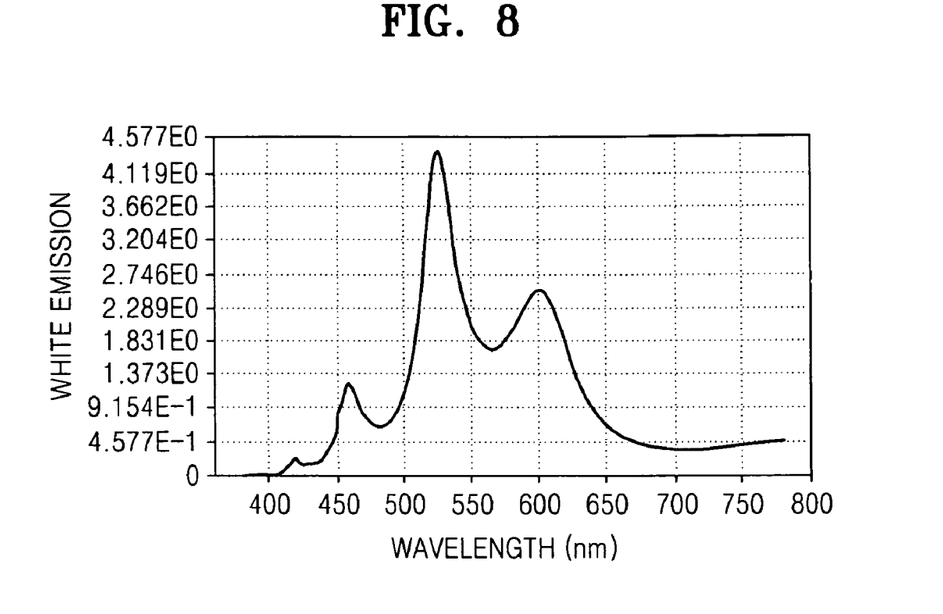
FIG. 8 is a two dimensional computer simulated graph of the amount of light of a white point light source emitted to the outside at a predetermined light emitting position in the white OLED of FIG. 7A when the resonance condition according to the principle of the present invention is satisfied.

Referring now to FIGS. 8-11, The third computer simulation was performed in such a manner that an optical thickness between cathode 17 and reflective electrode 12a was 396 nm, a resonance wavelength considering phase shift was 314 nm, and a thickness of optical path control layer 18' was 490 m, so that top emission type white OLED 10' having the structure of FIG. 7A satisfies Formula 2. The reflectivity of cathode 17 functioning as a semi-transparent electrode was set as 25%. In addition, the assumption is that identical white point light sources having identical intensities were respectively disposed at red light emitting layer 15R, blue light emitting layer 15B, and green light emitting layer 15G in white light emitting layer 15 illustrated in FIG. 7A. FIG. 8 is a computer simulation result graph of the amount of light emitted from each of the point light sources to the outside under the above conditions. Referring to FIG. 8, while peaks are divided in the red, green, and blue regions, overall, the resonance characteristic is broadly formed in the visible light region.

Figure 9:
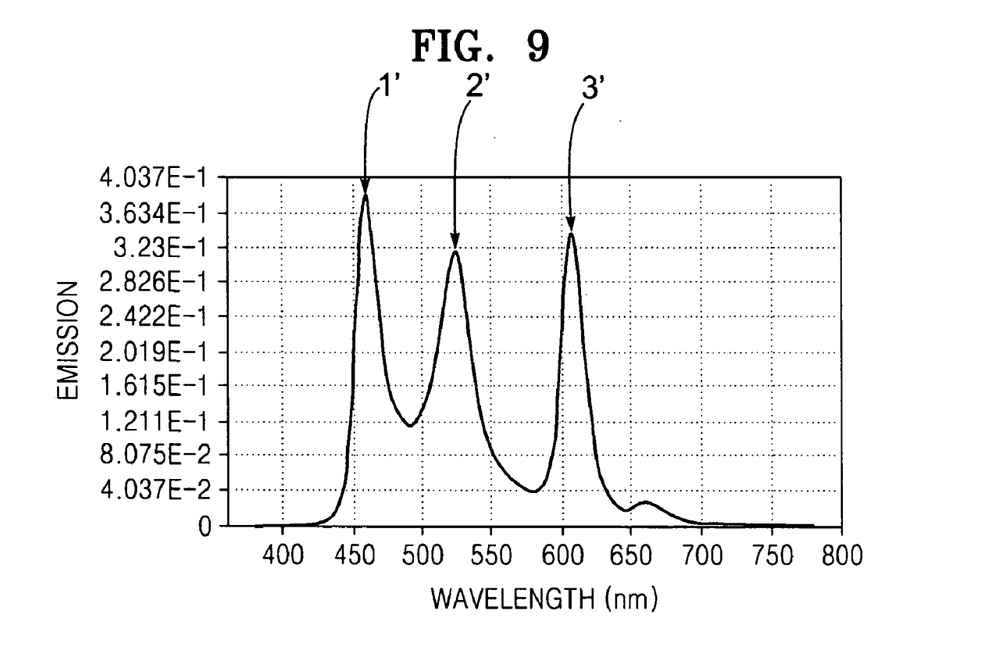
FIG. 9 is a two dimensional computer simulated graph of the amount of light of red, blue, and green point light sources emitted to the outside at a predetermined light emitting position in the white OLED of FIG. 7A when the resonance condition according to the principle of the present invention is satisfied.

Also, FIG. 9 is a computer simulation result graph of an external light emitting spectrum obtained by multiplying the result of the graph of FIG. 8 with the internal light emitting spectrums with respect to red, green, and blue light of FIG. 3 at the ratio of 2.3:0.6:2. In other words, FIG. 9 is a computer simulation result graph of the amount of red, blue, and green light respectively emitted from red light emitting layer 15R, blue light emitting layer 15B, and green light emitting layer 15G in the white OLED 10' of FIG. 7A to the exterior. Peak 1' represents the amount of blue light emitted from blue light emitting layer 15B, peak 2' represents the amount of green light emitted from blue light emitting layer 15G, and peaks 3' represents the amount of red light emitted from red light emitting layer 15R. As can be seen from FIG. 9, a purer white spectrum may be obtained at (0.298, 0.341) of the chromaticity coordinates.

Figure 10:
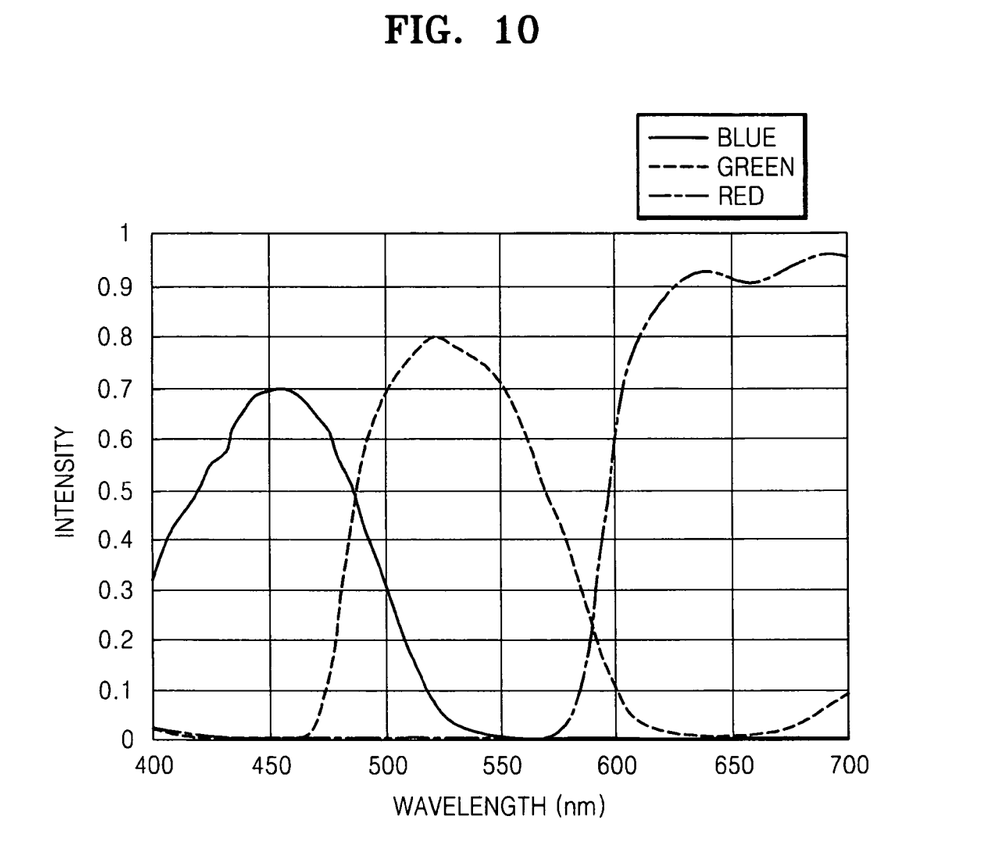
FIG. 10 is a two dimensional graph showing transmittivity spectrums of color filters used in the computer simulation of the present invention.
Figure 11:
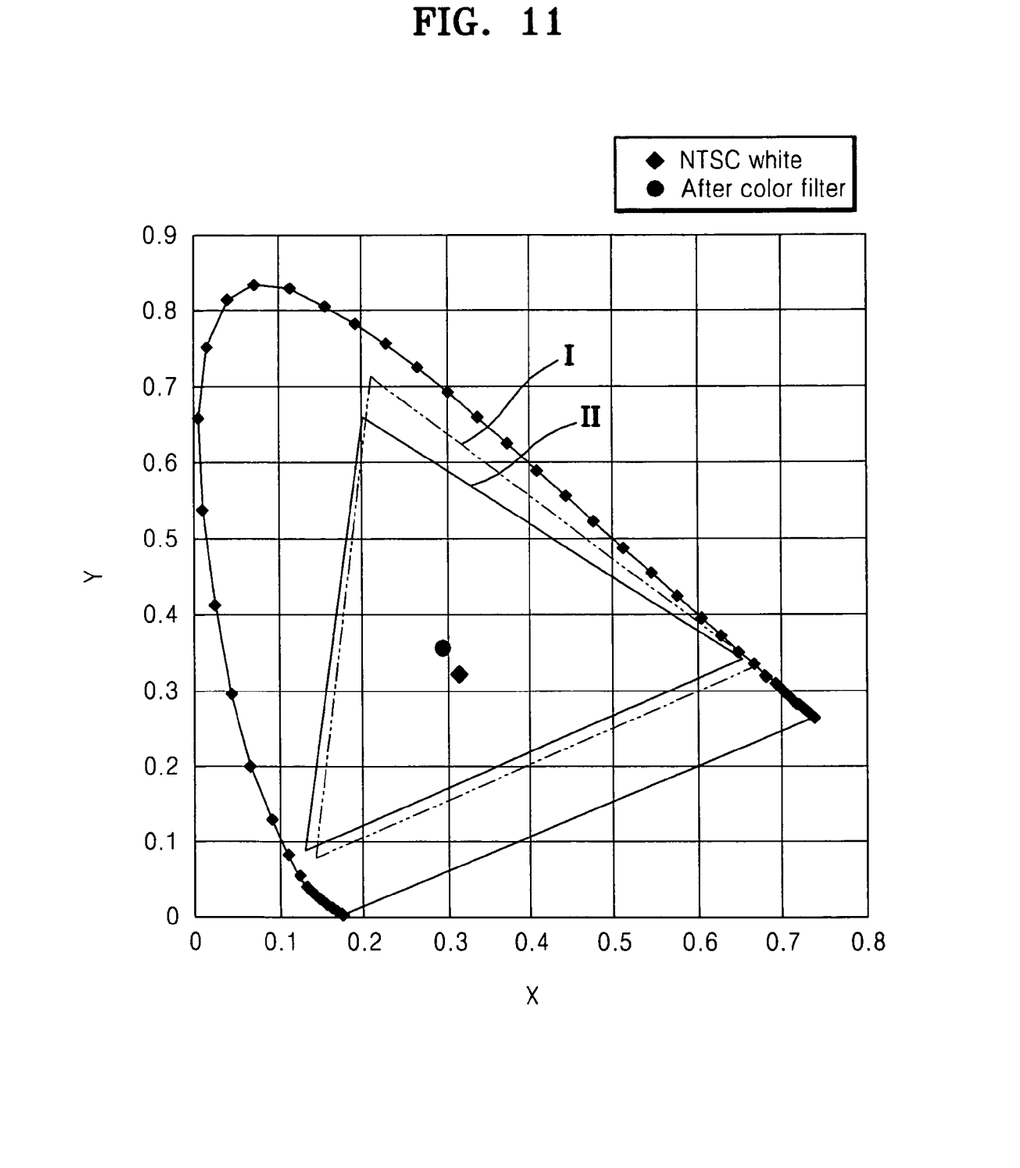
FIG. 11 is a two dimensional graph showing color realization characteristics by comparing chromaticity coordinates calculated using the spectrums of FIG. 9 and the transmittivity of the color filters of FIG. 10, and chromaticity coordinates of the National Television System Committee (NTSC) color system.

FIG. 10 is a graph showing transmittivity spectrums of color filters to be used in a computer simulation of the present invention. When the external light emitting spectrums of FIG. 9 are multiplied with the transmittivity spectrum of the color filter of FIG. 10, chromaticity coordinates of color light appearing when white light emitted from white OLED 10' passes through the red, green, and blue color filters, and a chromaticity coordinate of the combination of these colors, that is, white color, may be obtained. The resulting coordinate values of color in CIE x, y chromaticity diagram are shown in Table 1 below. Also, in order to compare the calculated chromaticity coordinates with the National Television System Committee (NTSC) color system, the chromaticity coordinates of the third computer simulation and the chromaticity coordinates of the NTSC color system are both shown in FIG. 11. In FIG. 11, outer triangle I is the NTSC color system, and inner triangle II is the chromaticity coordinates of the third computer simulation. According to the third computer simulation shown in FIG. 11, almost 89% of color reproduction range can be obtained compared to the NTSC system. Regarding components x, y in Table 1, components x, y are coordinate values of color in CIE x, y chromaticity diagram. Generally, a CIE system characterizes colors by a luminance parameter Y and two color coordinates x and y which specify the point on the chromaticity diagram.

TABLE 1

|  |  | X | Y |
| --- | --- | --- | --- |
| original | W | 0.298 | 0.341 |
| Color filter | W | 0.295 | 0.355 |
|  | R | 0.653 | 0.338 |
|  | G | 0.201 | 0.661 |
|  | B | 0.132 | 0.091 |

A top emission type white OLED having the structure illustrated in FIG. 1 was actually manufactured based on the result of the above-described computer simulations. According to the current embodiment of the present invention, an anode functioning as a reflective electrode having an ITO/Ag/ITO structure is formed on a glass substrate, and an HIL and an HTL are formed on the reflective electrode. Light emitting layers emitting light in the three wavelengths, that is, blue, red, and green colors, are formed on the HTL. Then an ETL and an EIL are formed on the light emitting layers. In addition, Ag having a thickness of 9 nm is formed on the EIL as a cathode functioning as a semi-transparent electrode. The reflectivity of the semi-transparent electrode was about 25% with respect to light having a wavelength of 550 nm. A capping layer having a thickness of 40 nm was formed on the semi-transparent electrode. The capping layer had a refractive index of about 2 with respect to the wavelength of 550 nm. The top emission type white OLED manufactured in this manner was encapsulated in an inactive atmosphere.

The material and thickness of the HIL were MTDATA and 200□, respectively, and the material and thickness of the HTL were NPB and 110□, respectively, and the thickness of the blue light emitting layer was 120□, the thickness of the green light emitting layer was 120□, the thickness of the red light emitting layer was 80□, the material and thickness of the ETL were Alq$_3$ and 180□, respectively, the material and thickness of the EIL were LiF and 7□, respectively, and the material of the capping layer was SiN$_x$. N$_2$ gas was used as the inactive atmosphere.

Figure 12:
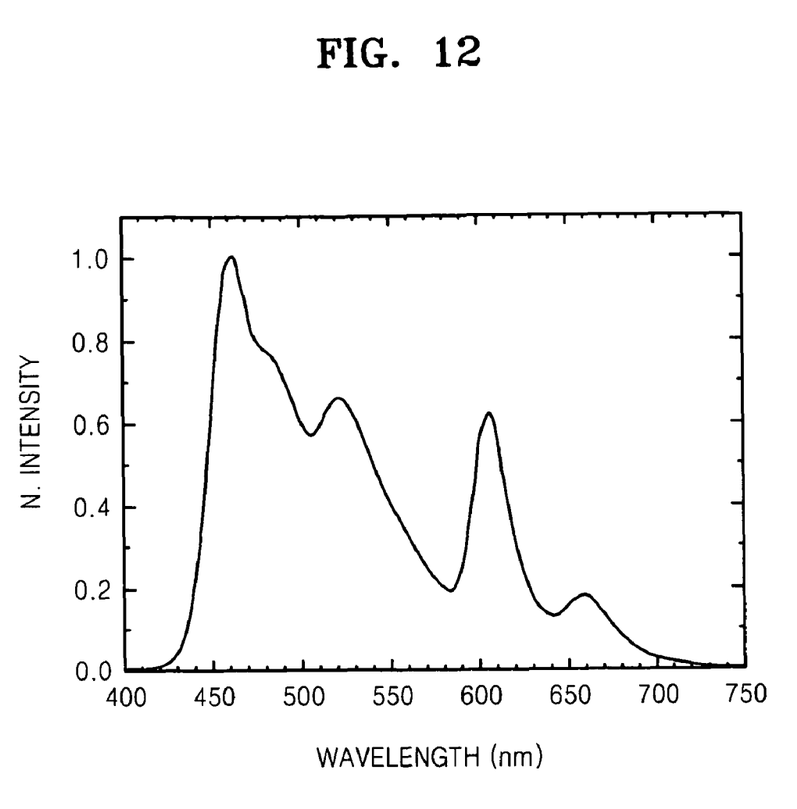
FIG. 12 is a two dimensional graph showing an external light emitting spectrum of the top emission type white OLED constructed as the present invention.

FIG. 12 is a graph showing an external light emitting spectrum of the top emission type white OLED manufactured in the above-described manner. Referring to FIG. 12, light emitted from the white OLED has three peaks in the three light wavelength regions, that is, blue, green, and red light wavelength regions. This is very similar to the result of the first computer simulation illustrated in FIG. 4. By calculating chromaticity coordinates from the result of FIG. 12, a white spectrum at (0.28, 0.29) can be found.

Figure 13:
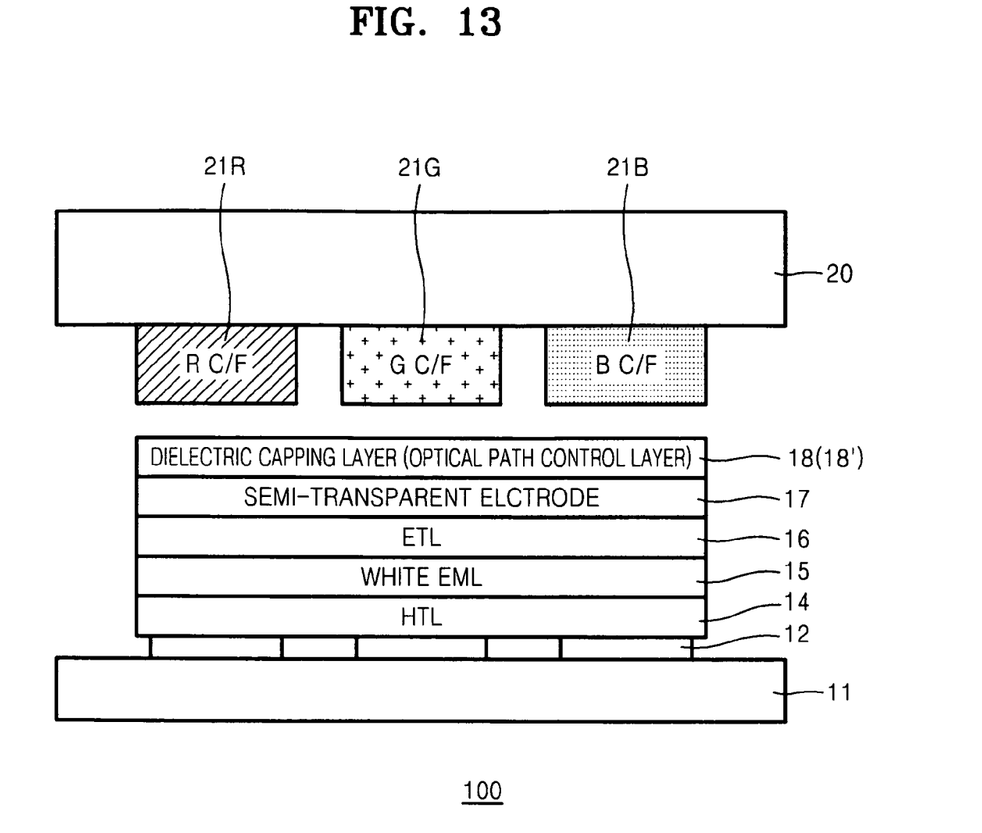
FIG. 13 is a cross-sectional view of a color display apparatus using the white OLED constructed as the present invention.

When the OLED according to the present invention is used in a color display apparatus, a color display apparatus having high color reproduction range may be obtained. FIG. 13 is a cross-sectional view of a color display apparatus 100 using white OLED 10 or 10' constructed as the present invention. Referring to FIG. 13, a plurality of reflective electrodes 12 are formed for each sub-pixel on a common substrate 11, and a hole transporting layer (HTL) 14, a white light emitting layer 15, an electron transporting layer (ETL) 16, a semi-transparent electrode 17, and a capping layer 18 (or an optical path control layer 18') may be formed on reflective electrodes 12. In addition, a transparent top substrate 20 is disposed to face capping layer 18 (or optical path control layer 18'), and red, green, and blue color filters 21R, 21G, and 21B are formed for each sub-pixel on a lower surface of top substrate 20. Although not illustrated in FIG. 13, a black matrix (BM), which completely absorbs external light, may be formed between each color filter in order to increase visibility, and gas or a filler having a low refractive index as a low refractive index layer may be in the space between top substrate 20 and capping layer 18 (or optical path control layer 18').

According to the present invention, as illustrated in FIG. 13, OLEDs including electrodes and light emitting layers may be formed in the same layer with respect to all sub-pixels irrespective of the colors of the sub-pixels. Also, in this case, the optical path between sub-pixels does not need to be controlled, and thus reflective electrodes 12 in the lower portion of the OLED may be designed to have the same structure. Also, according to the present invention, since the OLED may emit almost pure white color light, pure colors may be realized using color filters 21R, 21G, and 21B. Also, even when resonance occurs inside the OLED, since images are viewed through the color filters, dependency on the viewing angle can be significantly reduced.

According to the present invention, a white OLED generating improved white light may be provided.

While the present invention has been particularly shown and described with reference to exemplary embodiments thereof, it will be understood by those of ordinary skill in the art that the exemplary embodiments should be considered in descriptive sense only and not for purpose of limitation, and various changes in form and details may be made therein without departing from the spirit and scope of the present invention as defined by the following claims.

What is claimed is:

1. A white organic light emitting device (OLED), comprising:
   a substrate;
   a reflective electrode formed on the substrate;
   an organic light emitting layer formed on the reflective electrode, the organic light emitting layer emitting white light; and
   a semi-transparent electrode formed on the organic light emitting layer, wherein optical thicknesses of the organic light emitting layer and the semi-transparent electrode are configured such that a longest resonance wavelength between the reflective electrode and the semi-transparent electrode is shorter than a shortest wavelength in a visible light region of a white light spectrum generated in the organic light emitting layer, the longest resonance wavelength is 400 nm or less.

2. The white OLED of claim 1, in which a reflectivity of the semi-transparent electrode is within a range of 0.1% to 50% with respect to white light.

3. The white OLED of claim 2, in which the reflectivity of the semi-transparent electrode is within a range of 10 to 50% with respect to white light.

4. The white OLED of claim 1, in which the reflective electrode has one of a transparent conductive oxide/metal/transparent conductive oxide structure and a metal/transparent conductive oxide structure.

5. The white OLED of claim 4, in which the transparent conductive oxide comprises one of an indium tin oxide (ITO) and an indium zinc oxide (IZO).

6. The white OLED of claim 1, further including a capping layer formed on the semi-transparent electrode and formed of a transparent dielectric material having a refractive index within a range of 1.4 to 2.4.

7. The white OLED of claim 1, further comprising an optical path control layer that is formed on the semi-transparent electrode, to form an additional resonator in cooperation with the reflective electrode and the semi-transparent electrode.

8. The white OLED of claim 7, in which the optical path control layer is formed of a material having a light transmittivity of 90% or greater in a visible light region.

9. The white OLED of claim 8, in which the optical path control layer is formed of at least one combination selected from a group consisting of $Al_2O_3$, BaO, MgO, $HfO_2$, $ZrO_2$, $CaO_2$, $SrO_2$, $Y_2O_3$, $Si_3N_4$, AlN, GaN, ZnS, and CdS.

10. The white OLED of claim 7, further comprising a dielectric mirror layer on an upper surface of the optical path control layer.

11. The white OLED of claim 7, further comprising a metal mirror layer on an upper surface of the optical control layer.

12. The white OLED of claim 1, in which the organic light emitting layer comprises a hole injection layer, a hole transporting layer, a white light emitting layer, an electron transporting layer, and an electron injection layer sequentially stacked on the reflective electrode, and the reflective electrode is an anode, and the semi-transparent electrode is a cathode.

13. The white OLED of claim 1, in which the organic light emitting layer comprises an electron injection layer, an electron transporting layer, a white light emitting layer, a hole transporting layer, and a hole injection layer sequentially stacked on the reflective electrode, with the reflective electrode being a cathode and the semi-transparent electrode being an anode.

14. A color display apparatus, comprising:
a bottom substrate;
a plurality of reflective electrodes formed on the bottom substrate;
an organic light emitting layer formed on the reflective electrodes, the organic light emitting layer emitting white light;
a semi-transparent electrode formed on the organic light emitting layer;
a top substrate disposed to face the semi-transparent electrode; and
a plurality of color filters formed in positions corresponding to the reflective electrodes on a lower surface of the top substrate,
wherein optical thicknesses of the organic light emitting layer and the semi-transparent electrode are configured such that a longest resonance wavelength between the reflective electrodes and the semi-transparent electrode is shorter than a shortest wavelength in a visible light region of a white light spectrum generated in the organic light emitting layer, the longest resonance wavelength is 400 nm or less.

15. The color display apparatus of claim 14, in which a reflectivity of the semi-transparent electrode is within a range of 0.1 to 50% with respect to white light.

16. The color display apparatus of claim 15, in which the reflectivity of the semi-transparent electrode is within a range of 10 to 50% with respect to white light.

17. The color display apparatus of claim 14, in which the reflective electrode has one of a transparent conductive oxide/metal/transparent conductive oxide structure and a metal/transparent conductive oxide structure.

18. The color display apparatus of claim 14, further including a capping layer formed on the semi-transparent electrode and formed of a transparent dielectric material having a refractive index within a range of 1.4 to 2.4.

19. The color display apparatus of claim 14, further comprising an optical path control layer that is formed on the semi-transparent electrode, to form an additional resonator in cooperation with the reflective electrode and the semi-transparent electrode.

20. The color display apparatus of claim 19, in which the optical path control layer is formed of a material having a light transmittivity of 90% or greater in a visible light region.

* * * * *